United States Patent [19]

Greco et al.

[11] Patent Number: 4,997,746
[45] Date of Patent: Mar. 5, 1991

[54] METHOD OF FORMING CONDUCTIVE LINES AND STUDS

[76] Inventors: Nancy A. Greco; Stephen E. Greco, both of R.R. 3, Box 255B, Jennifer Hill Rd., Lagrangeville, N.Y. 12540

[21] Appl. No.: 274,895

[22] Filed: Nov. 22, 1988

[51] Int. Cl.⁵ .............................................. G03F 7/26
[52] U.S. Cl. .................................... 430/314; 430/316; 430/317; 430/318; 430/328; 437/229
[58] Field of Search ............... 430/313, 314, 318, 315, 430/328, 394, 312, 319, 316, 317; 437/229

[56] References Cited

U.S. PATENT DOCUMENTS

| | | | |
|---|---|---|---|
| 3,930,857 | 1/1976 | Bendz et al. | 430/313 |
| 4,315,984 | 2/1982 | Okazaki et al. | 430/296 |
| 4,541,893 | 9/1985 | Knight | 156/643 |
| 4,579,812 | 4/1986 | Boner | 430/313 |
| 4,721,689 | 1/1988 | Chaloux et al. | 437/189 |
| 4,767,723 | 8/1988 | Hinsberg et al. | 437/41 |
| 4,789,648 | 12/1988 | Chow et al. | 437/225 |

FOREIGN PATENT DOCUMENTS 0220578 10/1986 European Pat. Off. .

OTHER PUBLICATIONS

"Zero-Misalignment Lithographic Process Using a Photoresist with Wavelength-Selected Tone," by Hinsberg et al., SPIE, vol. 920, Advances in Resist Technology and Processing V (1988).

Primary Examiner—Jose G. Dees
Attorney, Agent, or Firm—Jeffrey L. Brandt

[57] ABSTRACT

A method is provided for forming a conductive stud and line over a surface, comprising the steps of: forming at least a first layer of material over the region on the surface whereat the conductive stud and line are to be formed; forming a layer of dual image photoresist over the material; exposing the dual image potoresist to radiation so as to form at least first and second regions exhibiting different development characteristics; developing the first region so as to expose a portion of the material; removing the exposed portion of the material so as to define the position of one of the conductive line or stud; developing the second region to expose more of the material; and removing the newly exposed portion of material so as to define the position of the other of the conductive line or stud.

4 Claims, 5 Drawing Sheets

METHOD OF FORMING CONDUCTIVE LINES AND STUDS

The present invention is directed generally to a method of manufacturing semiconductor devices, and more specifically to a method of forming conductive studs on conductive lines.

BACKGROUND OF THE INVENTION

Semiconductor chips generally comprise arrays of microelectronic devices, such as transistors, having contacts interconnected by patterns of conductive lines or wires. As the devices on these semiconductor chips become more and more densely packed, for example as is found in the Very Large Scale Integrated (VLSI) circuit technology used today, the interconnect patterns become correspondingly complex. As a result of this complexity, multiple levels of interconnect patterns/wires are required to wire up the many densely packed devices.

Such multiple levels of interconnect wiring, of which two to six are not uncommon for a state-of-the-art VLSI circuit, typically comprise layers of conductive lines separated by intermediary layers of insulating material. These separate levels of conductive lines are electrically interconnected by conductive studs extending through vias in the insulating layers.

As the complexity of the interconnect levels increases in correspondence with the density of the devices on the semiconductor chips, problems are encountered in forming the conductive lines and studs to the necessarily more stringent tolerances. Typical prior art processes, for example, require the use of multiple masks and lift-off steps to form the conductive lines and studs. In addition to the alignment problems and errors inherent in the use of multiple masking steps, these processes are complex, lengthy, and often require the use of several expensive, specialized manufacturing tools.

U.S. Pat. No. 4,721,689 to Chaloux, Jr. et al., assigned to the assignee of the present invention, shows a method for simultaneously forming an interconnection level over, and via studs through, an insulating layer of a semiconductor chip. The method comprises the steps of forming a plurality of via holes in the insulating layer, high-mobility sputtering conductive material onto the surface of the insulating layer and into the via holes, masking the conductive material layer, and ion beam milling through the mask to form a patterned interconnection layer.

The Chaloux, Jr. et al. patent suffers from the disadvantage of requiring two separate masking steps: the first to define the via holes and the second to define the patterned interconnection layer. The resulting product suffers from the alignment errors inherent in the use of the two masking steps. The patent further requires the etching of two highly disparate materials: the insulator defining the via holes, and the metal. This likely requires the use of two separate processing tools.

U.S. Pat. No. 4,541,893 to Knight shows a process for fabricating pedestal interconnections between conductive layers in an integrated circuit, including the steps of: (a) forming a first conductive layer over a semiconductor substrate; (b) applying a stop etch layer to the first conductive layer, the stop etch layer having a different etch property than the first conductive layer; (c) patterning the first conductive layer and the stop etch layer in an interconnection pattern which includes widened regions wherever a pedestal interconnection is to be formed; (d) selectively etching the stop etch layer until the stop etch layer remains as a stop etch cap only in central sections of the widened region; and (e) selectively etching the first conductive layer to a selected depth whereby a pedestal is formed underneath the stop etch caps.

Knight suffers from the disadvantage of requiring the widened regions (step (c)) to accommodate process tolerances and misalignments where pedestals are to be formed. These widened areas waste semiconductor chip space by limiting the minimum inter-wire distances. Further, too severe a misalignment in the forming of a widened region may result in the formation of an insufficiently small stud, or in no stud at all.

The following references each show the use of a dual tone photoresist in a self-aligning lithographic process. None of the references show or suggest the use of such a photoresist or process to form self-aligned conductive studs on lines.

U.S. Pat No. 4,767,723 to Hinsberg, III et al., assigned to the assignee of the present invention, shows a process for making thin film transistors using a dual tone photoresist.

Published European Patent Application 0 220 578 to Hinsberg, assigned to the assignee of the present invention, shows several embodiments of a dual tone photoresist. The application further shows the use of such a dual tone photoresist to form self-aligned structures on an underlying substrate.

The article, "Zero-Misalignment Lithographic Process Using A Photoresist with Wavelength-Selected Tone", to Hinsberg et al., SPIE Vol. 920, *Advances in Resist Technology and Processing V*, 1988, shows a dual tone photoresist, a mask for use with such a photoresist, and a self-aligning lithographic process utilizing the photoresist and mask.

SUMMARY OF THE INVENTION

The principal object of the present invention is to provide a new and improved method of forming a conductive stud on a conductive line.

Another object of the present invention is to provide such a method wherein the conductive stud is self-aligned with the conductive line through the use of a single mask defining both structures.

A further object of the present invention is to provide such a method that can be implemented in an economical manner using readily available semiconductor processing techniques.

A new and improved method of forming a conductive stud and line over a surface is provided, the method comprising the steps of: forming a layer of dual image photoresist over the region on the surface whereat the conductive line and stud are to be formed; exposing the dual image photoresist to radiation so as to form at least first and second regions exhibiting different development characteristics; and separately developing the first and second regions of the dual image photoresist to define the position of the conductive line and stud.

In one embodiment of the invention, the first and second regions of the photoresist are formed by exposing the photoresist to radiation through a single mask having at least one region for filtering the frequency of the radiation.

BRIEF DESCRIPTION OF THE DRAWINGS

These and other objects, features, and advantages of the present invention will become apparent from a consideration of the following detailed description of the invention when read in conjunction with the drawing Figures, in which.

DETAILED DESCRIPTION OF THE PRESENT INVENTION

Figure 1A:
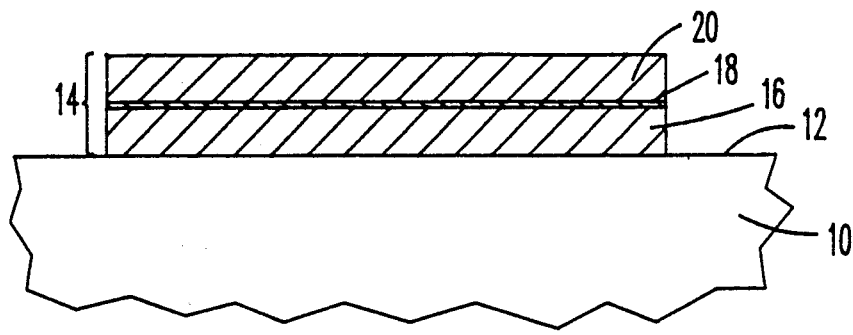
FIGS. 1A–1H are consecutive cross-sectional views showing a process implemented in accordance with a first embodiment of the invention.

Referring now to the embodiment of the invention illustrated in FIGS. 1A–1H, FIG. 1A shows a semiconductor device 10 including a major surface 12. In a conventional manner, device 10 includes conductive and semiconductive regions (not shown), for example transistor regions, to which it is desired to make electrical contact(s) at surface 12. While, for purposes of illustrating the present invention, surface 12 is shown in the Figs. as planar, the present invention is equally applicable to forming conductive lines and studs on non-planar surfaces. As a precursor to the practice of the present invention, surface 12 may optionally be cleaned of impurities such as native oxides, through, for example, bombardment with argon ions.

In accordance with this first embodiment of the invention, a stack 14 of conductive materials is formed over surface 12. Stack 14 includes a bottom layer 16 of aluminum-copper alloy formed to a thickness of about 1 micron, a middle or sandwich layer 18 of a conductive etch stop material formed to a thickness in the range of several thousand angstroms, and a top layer 20 of aluminum-copper alloy formed to a thickness of about 1 micron.

Layers 16, 20 can comprise any appropriate conductive material, while etch stop layer 18 is conductive and is selected to resist an etchant to be applied to top layer 20 (i.e. exhibits different etch characteristics than layer 20) in a manner described in further detail below. In the present embodiment of the invention, layer 18 comprises tungsten. Layers 16, 18, 20 are formed, for example, through conventional processes of evaporation or sputtering in a vacuum chamber.

Figure 1B:
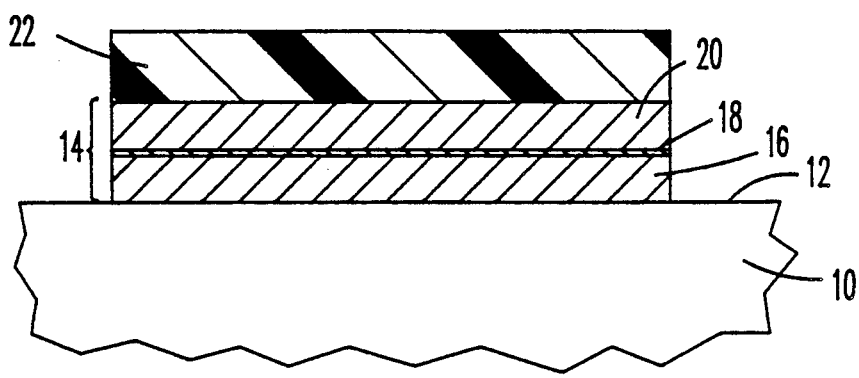

Referring now to FIG. 1B, subsequent to the formation of stack 14, a layer 22 of dual tone photoresist is deposited over layer 20. Photoresist 22 preferably comprises a dual tone photoresist of the type wherein exposure to ultra-violet (uv) radiations of different frequencies produces regions having different development characteristics. Suitable materials for photoresist 22 are described in the above-cited U.S. Pat. No. 4,767,723 to Hinsberg, III et al., published EPO patent application 0 220 578 to Hinsberg et al., and in the article "Zero-Misalignment Lithographic Process Using A Photoresist with Wavelength-Selected Tone" by Hinsberg et al., each of which is incorporated herein by reference. Photoresist 22 provides different development characteristics upon exposure to uv radiations in the near-uv range of 350–425 nm, and the mid-uv (or near- plus mid-uv) range of 300–325 nm. Briefly, the resist comprises a combination of a diazoketone/novolac positive resist and an azide-based negative resist, in a single composition.

Photoresist 22 is formed by conventional techniques, such as spinning and baking, to a thickness in the range of about 2 microns. It will be appreciated from a consideration of the remainder of the process described below that the appropriate thickness for photoresist 22 is determined by the relative etch rate of the photoresist in comparison to the etch rate of underlying stack 14.

Figure 1C:
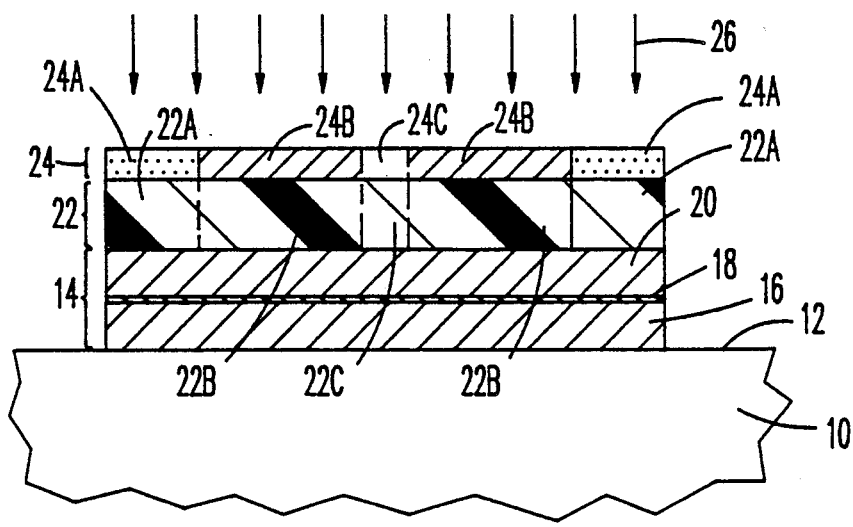

Referring now to FIG. 1C, subsequent to the formation of photoresist 22, a mask 24 is positioned intermediate the photoresist and a source (not shown) of broad range uv radiation 26. In accordance with the present embodiment of the invention, with photoresist 22 selected to be a dual tone photoresist of the type described above, mask 24 is formed to define three different regions having different filter or transmission characteristics. A first region 24A, through which a portion 22A of photoresist 22 will be irradiated, is selected to pass only near-uv radiation in the range of about 350–425 nm. A second region 24B, underlaid by a portion 22B of photoresist 22, is selected to be opaque to uv radiation. A third region 24C, through which a portion 22C of photoresist layer 22 will be irradiated, is selected to pass both near-and mid-uv radiation in the range of about 300–425 nm. Thusly exposed, each region 22A, 22B, 22C will exhibit different development characteristics, these characteristics being described in further detail below.

The references by Hinsberg et al. cited above describe suitable materials for mask 24. Briefly, region 22C is selected to be bare quartz, region 22B is selected to be Cr/quartz mask, and region 22A is selected to be a polymer film with or without a dye, a multilayer dielectric interference filter, or a spin-on-glass of inorganic oxide. It will be appreciated that, through the use of single mask 24 to expose/block the underlying regions 22A, 22B, 22C in photoresist layer 22, these regions are self-aligned, their relative positions being constant from exposure to exposure.

Figure 1D:
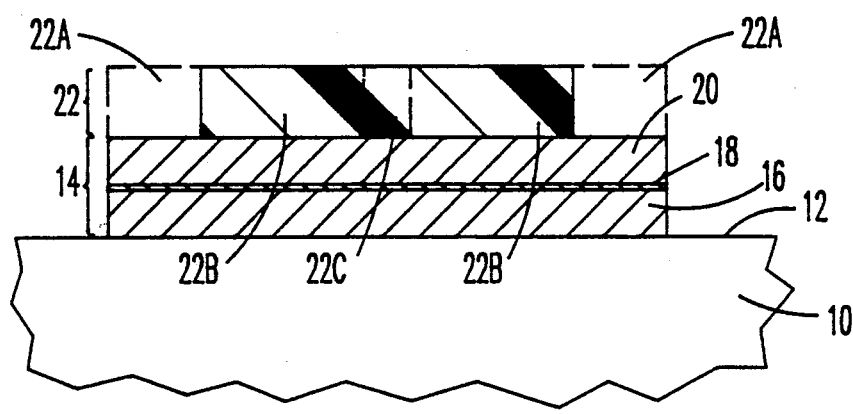

Referring now to FIG. 1D, an aqueous base developer, such as sodium metasilicate, or KOH and water, is used to develop and hence remove region 22A of dual image photoresist layer 22, this region having been exposed to near-uv radiation through mask 24 in the manner described above. The remaining regions of photoresist layer 22, having been unexposed or exposed to mid-uv, are not soluble in the aqueous base developer, and hence remain. As will be appreciated from a consideration of the remaining process steps, this development of region 22A functions to define the position of a subsequently formed conductive line, the line position being defined by a masking effect of the remaining photoresist regions 22B, 22C.

Figure 1E:
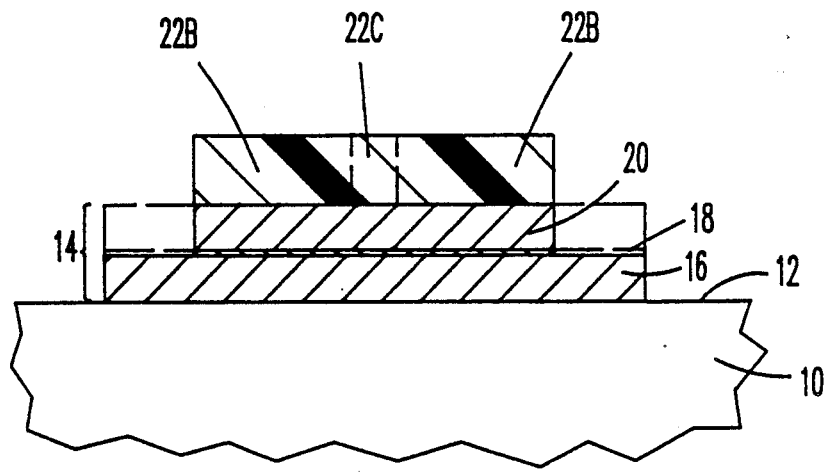

Referring now to FIG. 1E, an anisotropic (i.e. directional) reactive ion etch (RIE), such as a mixture of chlorine, boron trichloride, chloroform, and nitrogen, is used to remove the portion of layer 20 exposed by the development of photoresist region 22A. The remaining regions of photoresist layer 22 function as a mask during this RIE process. The parameters of this RIE process are selected so as to prevent overheating and resultant flowing or degradation of the imaging capability of the remaining regions of photoresist layer 22, and the RIE process is continued until etch stop 18 is exposed. The etching may then optionally be continued. i.e. "over etched", for a short period of time sufficient to insure a clean and complete etch. The composition of etch stop 18 was, of course, selected previously so as to be resistant to removal by the selected etchant. Alternatively to the above-described RIE process, ion milling can be used to remove the exposed portions of layer 20 down to etch stop 18.

Subsequent to the removal of the exposed portion of layer 20, the exposed portion of etch stop layer 18 (i.e. that portion underlying developed photoresist region 22A) is removed. This exposed portion of etch stop layer 18 is preferably removed in the same tool used to RIE process the exposed portions of layer 20 above, with the substitution of an appropriate etchant such as a carbon tetrafluoride gas. Again, a short over etch may be performed to ensure a clean and complete etch.

Subsequent to the completion of the etch of the exposed portion of etch stop layer 18, the exposed metal is passivated to prevent subsequent corrosion by residual chlorine. This passivation may be accomplished, for example, by rinsing the device in deionized water to dissolve any residual chlorine ions.

Figure 1F:
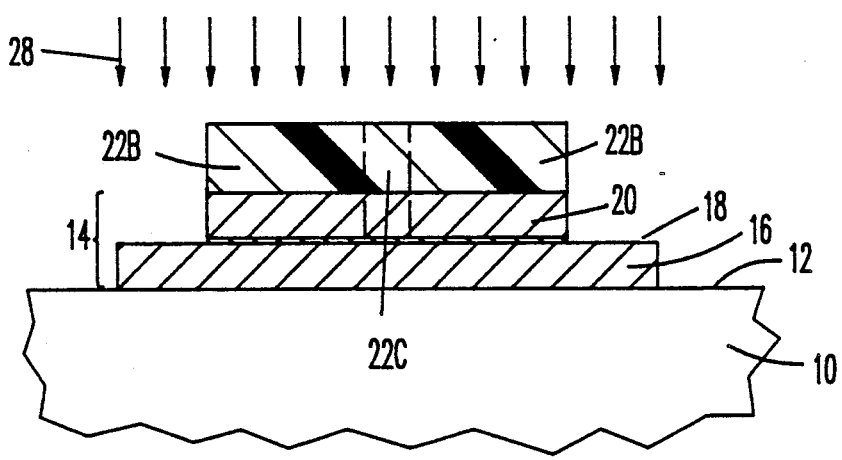

Referring now to FIG. 1F, in the preferred embodiment of the invention, the remaining portions of photoresist layer 22 are blanket exposed to a source (not shown) of near-uv radiation 28. This blanket exposure to near-uv radiation acts to provide photoresist region 22B, unexposed during the first uv exposure, with the same development characteristics as previously developed photoresist region 22A. It will be appreciated that the development characteristics of photoresist region 22C, cross-linked by previous exposure to mid-uv radiation, are unaffected by this blanket exposure.

Figure 1G:
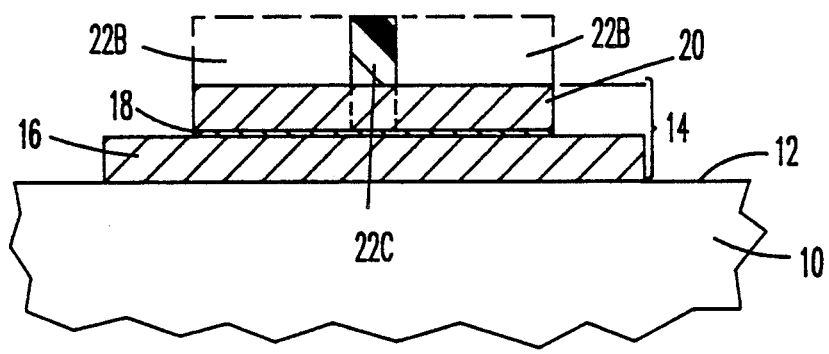

Referring to FIG. 1G, the semiconductor device is immersed in an aqueous base developer, preferably identical to the KOH and water developer described above for developing photoresist region 22A, so as to develop photoresist region 22B. As will be appreciated by a consideration of the remaining process described below, this development of photoresist region 22B defines the position of a subsequently formed conductive stud, the stud position being defined by the masking action of remaining photoresist region 22C.

From a consideration of the process steps described above with respect to FIGS. 1F and 1G, it will be understood that the blanket exposure and subsequent aqueous base development is not the only method by which to provide the device shown in the FIG. 1G. Alternatively, the blanket exposure can be omitted, and photoresist region 22B can be removed through the use of a suitable organic solvent such as N-butyl acetate. The preferred embodiment described above, however, is particularly efficient in that it makes use of the same tool and chemicals used to etch photoresist region 22A.

Figure 1H:
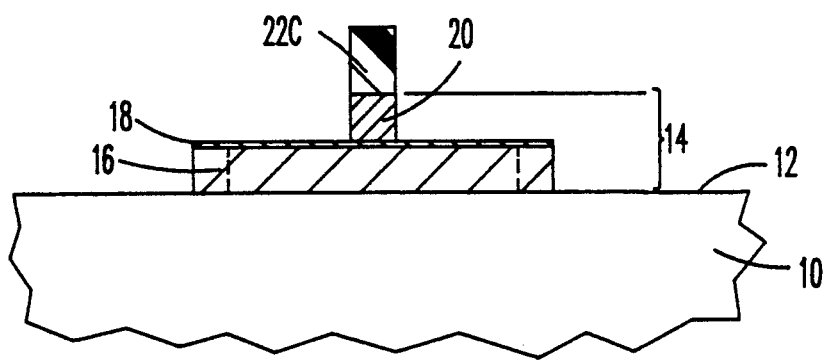

Referring now to FIG. 1H, an RIE process is utilized to remove the newly exposed portions of layer 20 (i.e. those portions exposed by developing photoresist region 22B) down to etch stop layer 18, while simultaneously removing the exposed portions of layer 16 (i.e. those portions which previously underlaid photoresist region 22A). The RIE etchant used is preferably identical to that described with respect to the removal of portions of layer 20 in FIG. 1E above, i.e. a mixture of chlorine, boron trichloride, chloroform, and nitrogen. The remaining exposed portions of etch stop layer 18 may optionally be removed using an RIE process with carbon tetrafluoride. Subsequent to the completion of the etching, the semiconductor is again passivated by rinsing in de-ionized water.

From a consideration of the process steps described above with respect to FIGS. 1E-1H, several alternate methods of removing the etched regions of layers 16, 18, 20 will immediately suggest themselves to those skilled in the art. For example, the portions of stack 14 underlying photoresist region 22A can be removed in total before the development of photoresist region 22B and the subsequent etching of newly exposed portions of layer 20. This may, however, expose the remaining portions 22B, 22C of photoresist, as well as surface 12 of the device, to an undesirable duration of RIE process.

It will also be appreciated that stack 14 need not comprise the triple layer stack shown in the described embodiment. Alternatively, the stack can exclude etch stop 18, and comprise a single, relatively thicker layer of conductive material. The stack can also comprise a multi-layer structure including additional layers selected to improve the electromigration characteristics of the resultant lines and studs.

Figure 1I:
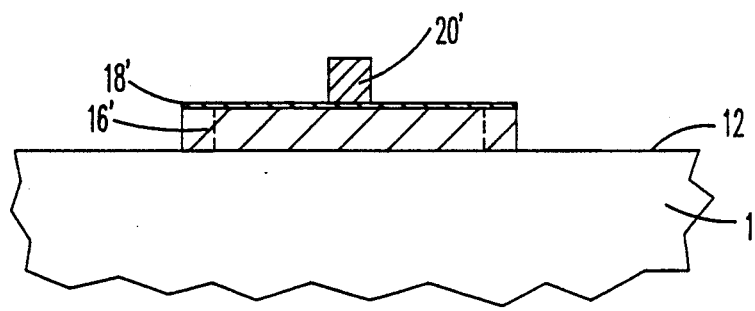
Figure 2:
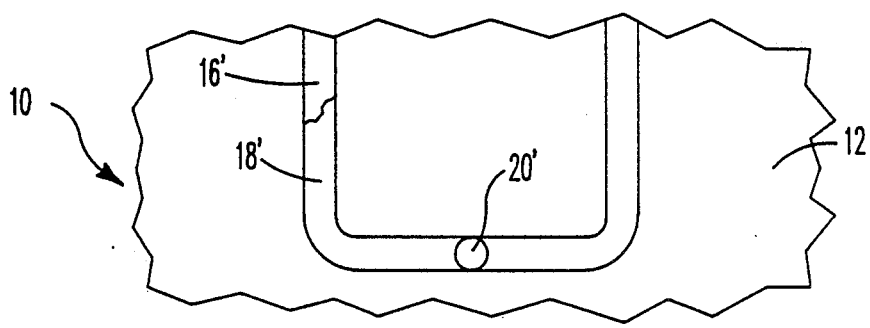
FIG. 2 is a top view of FIG. 1H.

Referring now to FIGS. 1I and 2, the remaining region 22C of photoresist is removed by etching with an oxygen plasma in a barrel asher. There is thus provided the resulting conductive line 16'/18' with conductive stud 20'. (The features are indicated with primed numbers to distinguish them from the original layers). It will be appreciated that, when a single mask 24 is used to expose dual image photoresist 22 as described with respect to FIG. 1C above, conductive stud 20' can be formed in self-aligned, exact registry with the underlying conductive line 16'/18'. No further masks are required to align the two features.

Referring now to the embodiment of the invention illustrated in FIGS. 3A-3H, FIG. 3A shows a semiconductor device 30 including a major surface 32. In a conventional manner, device 30 includes conductive and semiconductive regions (not shown), for example transistor regions, to which it is desired to make electrical contact(s) at surface 32. While, for purposes of illustrating the present invention, surface 32 is shown in the Figs. as planar, the present invention is equally applicable to forming conductive lines and studs on non-planar surfaces.

In accordance with this second embodiment of the invention, a stack 34 of insulating materials is formed over surface 32. Stack 34 includes a bottom layer 36 of amorphous silicon oxide (referred to herein as quartz) formed to a thickness of about 1 micron, an etch stop sandwich or middle layer 38 of aluminum oxide formed to a thickness in the range of several thousand angstroms, and a top layer 40, also of quartz, formed to a thickness of about 1 micron.

It will be understood that layers 36, 40 can comprise any appropriate insulating materials, while etch stop layer 38 is selected to be both insulating and resistant to a subsequently applied etch in a manner described in further detail below. Stack 34, could, for example, alternatively comprise top and bottom insulating layers of polyimide, with a middle etch stop layer of quartz.

Insulating layers 36, 38, 40 are formed by conventional processes. Quartz, for example, is deposited by sputtering, i.e. by bombarding a target of amorphous silicon oxide with argon ions in a vacuum chamber. The process is controlled such that silicon and oxygen atoms, or groups of such atoms, are ejected from the target to form quartz on the desired region. Polyimide can be deposited by conventional spin coating and baking processes, and aluminum oxide can be deposited by sputtering.

Figure 3A:
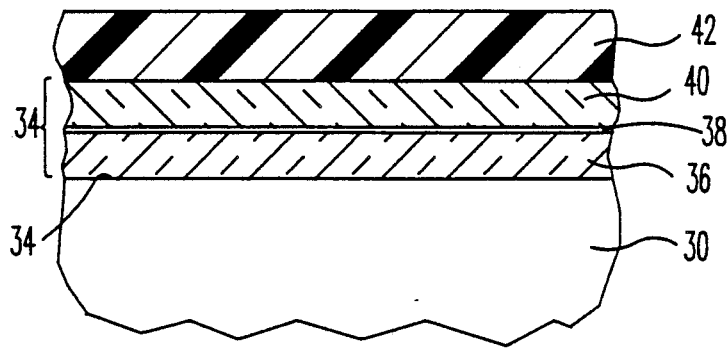
FIGS. 3A–3I are consecutive cross-sectional views showing a process implemented in accordance with another embodiment of the present invention.

Subsequent to the formation of stack 34, a layer 42 of dual tone photoresist is deposited over layer 40 to provide the device shown in FIG. 3A. In the preferred embodiment of the invention, photoresist 42 comprises a dual tone photoresist of the type wherein exposure to radiations of different frequencies produces regions having different development characteristics. Suitable materials for photoresist 42 are described in the above-cited U.S. Pat. No. 4,767,723 to Hinsberg, III et al., published EPO patent application 0 220 578 to Hinsberg et al., and in the article "Zero-Misalignment Lithographic Process Using A Photoresist with Wavelength-Selected Tone" by Hinsberg et al., each of which is incorporated herein by reference. Preferred photoresist 42 provides different development characteristics upon exposure to ultra-violet (uv) radiation in the near-uv range of 350–425 nm, and the mid-uv (or near plus mid-uv) range of 300–325 nm. Briefly, the photoresist comprises a combination of a diazoketone/novolac positive resist and an azide-based negative resist, in a single composition.

Photoresist 42 is formed by conventional techniques, such as spinning and baking, to a thickness in the range of about 2 microns. It will be appreciated from a consideration of the below that the appropriate thickness for photoresist 42 is determined by the relative etch rate of the photoresist in comparison to the etch rate of underlying stack 34.

Figure 3B:
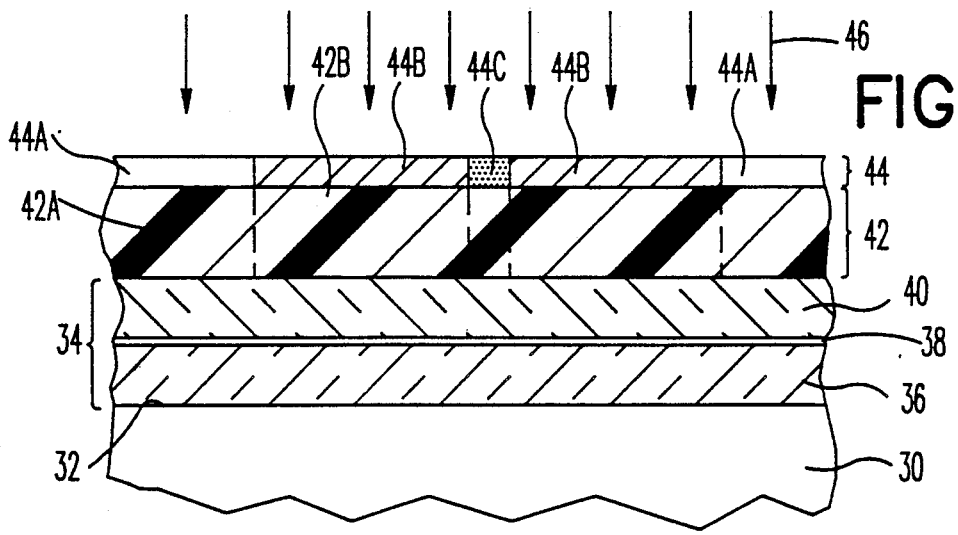

Referring now to FIG. 3B, subsequent to the formation of photoresist 42, a mask 44 is positioned intermediate the photoresist and a source (not shown) of broad range uv radiation 46. In accordance with the present embodiment of the invention, with photoresist 42 selected to be a dual tone photoresist of the type described above, mask 44 is formed to define three different regions having different filter or transmission characteristics. A first region 44C, through which a portion 42C of photoresist 42 will be irradiated, is selected to pass only near-uv radiation in the range of about 350–425 nm. A second region 44B, underlaid by a portion 42B of photoresist 42, is selected to be opaque to uv radiation. A third region 44A, through which a portion 42A of photoresist layer 42 will be irradiated, is selected to pass mid-uv (and near-uv) radiation in the range of about 300–425 nm. Thusly exposed, each region 42A, 42B, 42C of photoresist layer 42 will exhibit different development characteristics, these characteristics being described in further detail below.

The article to Hinsberg et al. cited above describes preferred materials for mask 44. Briefly, region 44A is selected to be bare quartz, region 44B is selected to be Cr/quartz mask, and region 44C is selected to be a polymer film with or without a dye, a multilayer dielectric interference filter, or a spin-on-glass of inorganic oxide. It will be appreciated that, through the use of a single mask 44 to expose/block the underlying regions 44A, 44B, 44C in photoresist layer 42, these regions are self-aligned, their relative positions being constant from exposure to exposure.

Figure 3C:
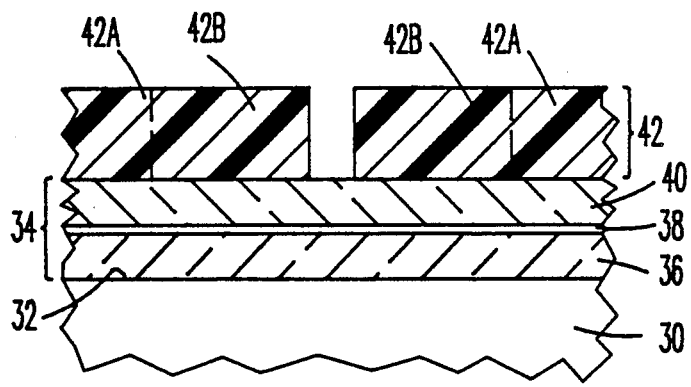

Referring now to FIG. 3C, an aqueous base developer, such as KOH and water, is used to develop and hence remove region 42C of dual image photoresist layer 42, this region having been exposed to near-uv radiation through mask 44 in the manner described above. The remaining regions of photoresist layer 42, having been unexposed or exposed to mid-uv radiation, are not soluble in the aqueous base developer, and hence remain. As will be appreciated from a consideration of the remaining process steps, this development of region 42C functions to define the position of a subsequently formed conductive stud, the stud position being defined by a masking action of the remaining regions of photoresist 42A, 42B in forming a matrix in the underlying stack 34. (For purposes of best illustrating the present invention, FIGS. 3C–3G are shown as 2-dimensional cross-sections).

Figure 3D:
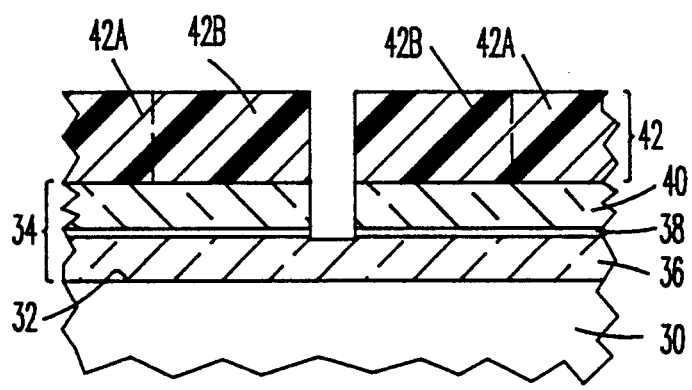

Referring now to FIG. 3D, an anisotropic (i.e. directional) reactive ion etch (RIE), such as carbon tetrafluoride (oxygen gas for polyimide), is used to remove the portion of layer 40 exposed by the development of photoresist region 22A. The parameters of this RIE process are selected so as to prevent overheating and hence flowing or a degradation in the imaging capability of the remaining regions of photoresist layer 42, and the etching is continued until etch stop 38 is exposed. The etching may then optionally be continued. i.e. "over etched", for a short period of time sufficient to insure a clean and complete etch. The composition of etch stop 38 was, of course, selected previously so as to be resistant to removal by the selected etchant. Alternatively to the above-described RIE process, ion milling can be used to remove the exposed portions of layer 40 down to etch stop 38.

Subsequent to the removal of the exposed portion of layer 40, the exposed portion of etch stop layer 38 is removed. This exposed portion of etch stop layer 38 is preferably removed in the same tool used to RIE process exposed portions of layer 40 above, with the substitution of an appropriate etchant such as a boron trichloride gas (carbon tetrachloride for RIE processing silicon oxide). Again, a short over etch may be performed to insure a clean and complete etch.

Referring now to FIG. 3D, in the preferred embodiment of the invention, the remaining portions of photoresist layer 42 are blanket exposed to a source (not shown) of near-uv radiation 48. This blanket exposure to near-uv radiation acts to provide photoresist region 42B, unexposed during the first uv exposure, with the same development characteristics as previously developed photoresist region 42C. It will be appreciated that the development characteristics of photoresist region 42A, cross-linked by previous exposure to deep-uv radiation, are unaffected by this blanket exposure.

Figure 3E:
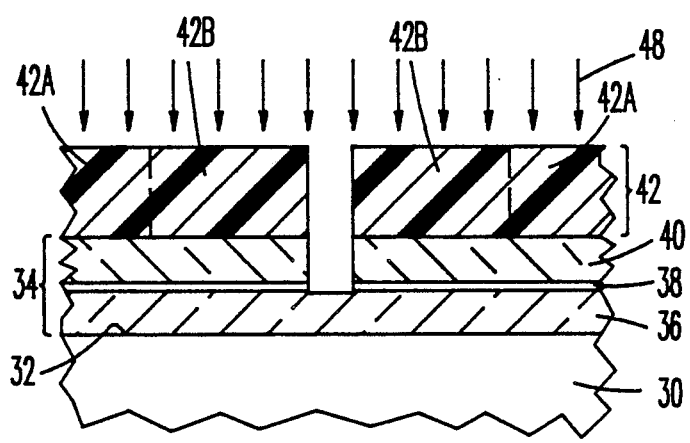
Figure 3F:
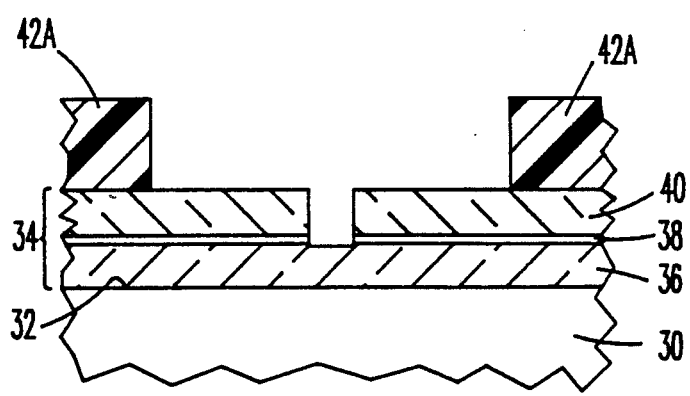

Referring now to FIG. 3F, the semiconductor device is immersed in an aqueous base developer, preferably identical to the KOH and water described above, so as to develop photoresist region 42B. As will be appreciated by a consideration of the remaining process described below, this development of photoresist region 42B defines the position of a subsequently formed conductive line, the line position being defined by the masking action of remaining photoresist region 42A in forming a matrix in underlying stack 34.

From a consideration of the above-described process steps with respect to FIGS. 3E and 3F, it will be understood that the blanket exposure and subsequent aqueous base development is not the only method by which to provide the device shown in FIG. 3F. Alternatively, the blanket exposure can be omitted, and photoresist region 42B can be removed through the use of an appropriate organic solvent such as N-butyl acetate. The preferred embodiment described above, however, is particularly efficient in that it makes use of the same tool and chemicals used to etch photoresist region 42A.

Figure 3G:
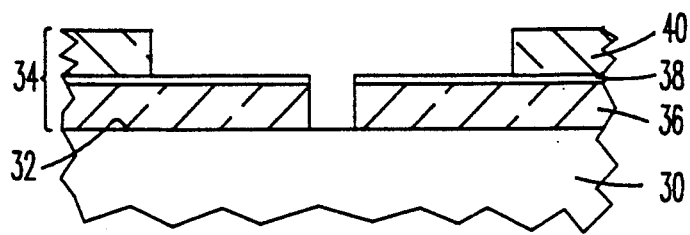

Referring now to FIG. 3G, an RIE process process is utilized to remove the newly exposed portions of layer 40 (i.e. those portions exposed by developing photoresist region 42B) down to etch stop layer 38, while simultaneously removing the exposed portions of layer 36 (i.e. those portions which previously underlaid photoresist region 42C). The RIE process process used is preferably identical, i.e. a carbon tetrafluoride etch, to that described with respect to the removal of portions of layer 40 in FIG. 3D above. Exposed portions of etch stop layer 38 can optionally be removed using an RIE process with boron trichloride. After its function as a mask is complete, the remaining region 42A of photoresist is removed through the use of oxygen plasma in a barrel asher.

From a consideration of the process steps described above with respect to FIGS. 3D–3G, several alternative methods of removing the etched regions of layers 36, 38, 40 will immediately suggest themselves to those skilled in the art. For example, the portion of stack 34 underlying photoresist region 42C can be removed in its entirety before the development of photoresist region 42B and the subsequent etching of layer 40 there under. This may, however, expose the remaining portions 42A, 42B of photoresist, as well as surface 32, to an undesirable duration of RIE process.

It will also be appreciated that stack 34 need not comprise the triple layer stack shown in the described embodiment. Alternatively the stack can exclude the etch stop layer 38, and comprise a single, relatively thicker layer of conductive material. Stack 34 can also comprise additional layers for the purpose of composite insulation.

At this stage in the process, the surface of the device can optionally be cleaned of impurities such as native oxides, through, for example, bombardment with argon ions.

Figure 3H:
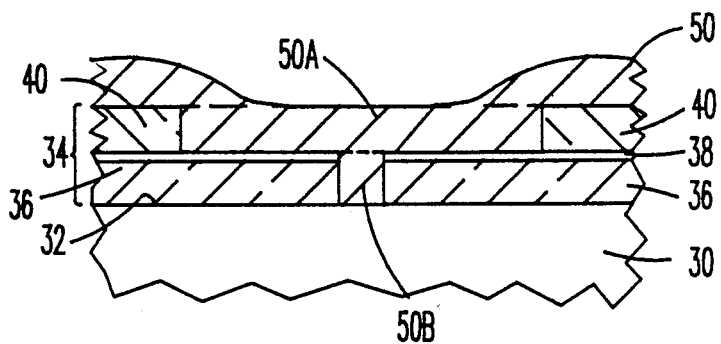

Referring now to FIG. 3H, a layer 50 of conductive material, for example a metal such as an aluminum-copper alloy, is deposited generally conformally over the top of the device, including exposed portions of surface 32 and layers 36, 38, 40. Metal layer 50 fills the matrix formed by the remaining portions of stack 34 to provide a conductive line 50A and stud 50B.

Figure 3I:
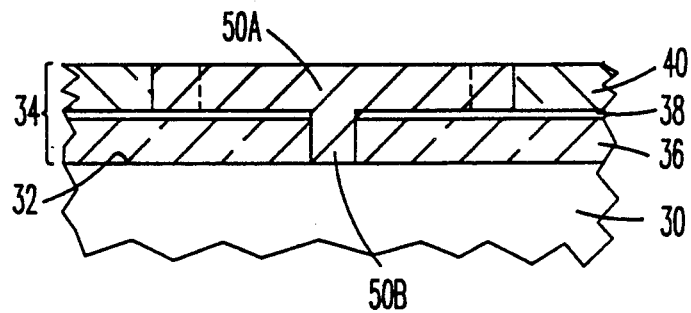
Figure 4:
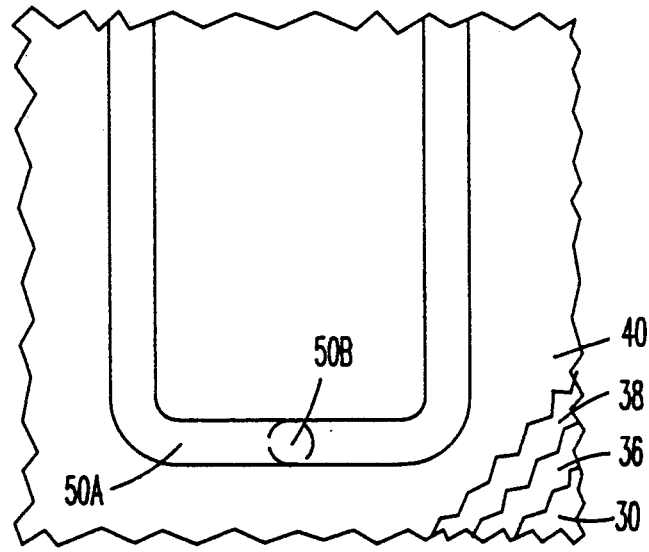
FIG. 4 is a top view of FIG. 3I.

Referring now to FIGS. 3I and 4, one of many known planarizing techniques, such as chemicalmechanical polishing, is used to remove the regions of metal layer 50 outside of the matrix formed by the remaining portions of stack 34, so as to define conductive line 50A and conductive stud 50B. In this embodiment of the invention, stud 50B extends downwardly from conductive line 50A into contact with surface 32 of the device, the conductive line being insulated from the surface by intervening portions of insulating layers 36, 38. It will be appreciated that, when a single mask 44 is used to expose dual image photoresist 42 as described with respect to FIG. 3B above, conductive stud 50B is formed in self-aligned, exact registry with the overlying conductive line 50A. No further masks are required to align the two features.

While both of the embodiments of the invention described above show the use of a dual tone (i.e. positive and negative image) photoresist, it will be understood that the invention is not so limited. It will be apparent to those skilled in the art that any dual image photoresist, including photoresists having dual positive or dual negative images, are equally applicable. Further, the photoresist used is not limited to those sensitive to different uv radiation wavelengths. Dual image photoresists showing varying sensitivities to differing radiation dosages, or any vehicle by which two separately developable regions can be defined, are equally applicable.

There have thus been provided methods for forming conductive studs on conductive lines in self-aligned processes which do not require the alignment of multiple masks. The methods are capable of economical manufacture using conventional semiconductor processing techniques. The methods have application in the manufacture of semiconductor devices, and particularly in the fabrication of electrical contacts on VLSI semiconductor chips wherein alignment tolerances are critical.

While the present invention has been shown and described with reference to particular embodiments, it will be understood by those skilled in the art that various changes in form and detail may be made therein without departing from the spirit and scope of the invention.

What is claimed is:

1. A method of forming a conductive stud self-aligned on a conductive line, comprising the steps of:
   providing a semiconductor device having a surface over which it is desired to form said conductive line and stud;
   forming at least a first layer of conductive material over the region on said surface whereat said conductive stud and line are to be formed;
   forming a layer of dual tone photoresist over said conductive material, said dual tone photoresist including at least two sensitizers responsive to radiation of different wavelengths;
   exposing said dual tone photoresist to at least two different wavelengths of radiation through a single mask so as to form first, second, and third regions having different development characteristics;
   developing said first region to exposure an underlying portion of said conductive material;
   etching the exposed portion of conductive material using the remaining dual tone photoresist as a mask to form said conductive line;
   blanket exposing said dual tone photoresist to radiation such that said second region has the same development characteristics as said first region;
   developing said second region so as to expose more of said conductive material;
   etching the newly exposed conductive material using the remaining dual tone photoresist as a mask to provide said stud; and
   removing the dual tone photoresist.

2. A method in accordance with claim 1 wherein:
   said step of forming at least a layer of conductive material comprises forming a stack including a first layer of conductive material, a layer of conductive etch stop, and a second layer of conductive material consecutively over said surface;
   the first etch step including etching through said stack at least to said conductive etch stop;
   the second etch step including etching through the newly exposed portion of said stack at least to said etch stop while simultaneously etching any remaining portion of said first conductive layer exposed during the first etch step to said surface.

3. A method of forming a conductive stud self-aligned on a conductive line, comprising the steps of:
   providing a semiconductor device having a surface over which it is desired to form said conductive line and stud;

forming at least a first layer of insulating material over the region on said surface whereat said conductive stud and line are to be formed;

forming a layer of dual tone photoresist over said insulating material, said dual tone photoresist including at least two sensitizers responsive to radiation of different wavelengths;

exposing said dual tone photoresist to at least two different wavelengths of radiation through a mask so as to form first, second, and third regions having different development characteristics;

developing said first region to expose an underlying portion of said insulating material;

etching the exposed portion of insulating material using the remaining dual tone photoresist as a mask to form a matrix for forming said conductive stud;

blanket exposing said dual tone photoresist to radiation such that said second region has the same development characteristics as said first region;

developing said second region so as to expose more of said insulating material;

etching the newly exposed insulating material using the remaining dual tone photoresist as a mask to provide a matrix for forming said conductive line; and filling said stud and line matrices with a conductive material.

4. A method in accordance with claim 3 wherein:

said step of forming at least a layer of insulating material comprises forming a stack including a first layer of insulating material, a layer of insulating etch stop, and a second layer of insulating material consecutively over said surface;

the first etch step including etching through said stack at least to said insulating etch stop;

the second etch step including etching through the newly exposed portion of said stack at least to said insulating etch stop while simultaneously etching through any remaining portion of said first insulating layer exposed during said first etch step to said surface.

* * * * *